(12) United States Patent
van der Valk et al.

(10) Patent No.: US 7,619,483 B2
(45) Date of Patent: Nov. 17, 2009

(54) ASYNCHRONOUS PHASE ACQUISITION UNIT WITH DITHERING

(75) Inventors: Robertus Laurentius van der Valk, Capelle aan den IJssel (NL); Paulus Hendricus Lodewijk Maria Schram, Bergen op Zoom (NL); Douglas Robert Sitch, Plymouth (GB)

(73) Assignee: Zarlink Semiconductor Inc. (CA)

( * ) Notice: Subject to any disclaimer, the term of this patent is extended or adjusted under 35 U.S.C. 154(b) by 43 days.

(21) Appl. No.: 11/939,948

(22) Filed: Nov. 14, 2007

(65) Prior Publication Data

US 2008/0116980 A1 May 22, 2008

(30) Foreign Application Priority Data

Nov. 17, 2006 (GB) .................................. 0622941.3

(51) Int. Cl.
*H03L 7/06* (2006.01)
(52) U.S. Cl. .......................................... 331/18; 331/25
(58) Field of Classification Search ................ 331/1 A, 331/8, 16–18, 25; 327/156–159; 332/127; 360/51; 375/376; 455/260
See application file for complete search history.

(56) References Cited

U.S. PATENT DOCUMENTS

| 4,577,163 | A | 3/1986 | Culp |
| 5,381,116 | A | 1/1995 | Nuckolls et al. |
| 6,052,034 | A | 4/2000 | Wang et al. |
| 6,532,271 | B1 * | 3/2003 | Hwang et al. ............. 375/326 |
| 2002/0071512 | A1 | 6/2002 | Strhmayer |
| 2005/0206458 | A1 | 9/2005 | Wu |
| 2006/0056563 | A1 | 3/2006 | Aweya et al. |

FOREIGN PATENT DOCUMENTS

| EP | 1093227 A1 | 4/2001 |
| EP | 1217745 A3 | 8/2004 |
| EP | 1443653 A1 | 8/2004 |
| WO | WO9804042 A1 | 1/1998 |

* cited by examiner

*Primary Examiner*—David Mis
(74) *Attorney, Agent, or Firm*—Lawrence E. Laubscher, Jr.

(57) ABSTRACT

A digital phase locked loop includes a phase acquisition unit receiving a sampled input signal and applying its output to a first input of a digital phase detector, a digital controlled oscillator producing a digital output, and a feedback path coupling the digital output of the digital controlled oscillator to a second input of the digital phase detector in the digital domain. The input signal may be sampled asynchronously.

6 Claims, 6 Drawing Sheets

ASYNCHRONOUS PHASE ACQUISITION UNIT WITH DITHERING

FIELD OF THE INVENTION

This invention relates to the field of phase locked loops, and in particular to digital phase locked loops.

BACKGROUND OF THE INVENTION

In the design of phase locked loops (PLLs), a critical component is the phase detector since it has a number of factors that limit performance of the PLL. In digital PLL's the principal limitations become worse when the time domain is quantized.

A conventional analog PLL typically is constructed as shown in FIG. 1. A phase detector is used to determine the difference between two phase signals, one being the feedback signal. The output of the phase detector is fed to the filter section, which may for instance be P type only (Proportional) but typically will be PI type (Proportional Integral), yielding a so-called type II PLL. The filter feeds a controlled oscillator (which in FIG. 1 is a Voltage or Current Controlled Oscillator). The generated frequency is divided and fed back to the input.

The analysis of such a Phase Locked Loop or PLL is typically done using Black's formula to analyze bandwidth of the closed loop, overshoot, peaking and the like.

Analog PLL's have quite a few limitations for which digital PLL's have much better performance. This results from the different nature of digital PLL's, i.e. PLL's where the phase signal is sampled and then used to eventually control a Digitally Controlled Oscillator or DCO. The advantages that digital PLL's are:

a) Simple and accurate holdover. If there is no reference signal, a digital PLL can use its current or some historic DCO setting to sustain the same output frequency. A digital PLL will typically rely on stability of its clock signal to achieve this, which mostly will come from a crystal oscillator. Analog PLL's typically have much less stable elements in their structure to rely upon.

b) A digital PLL will have no difficulty providing extreme bandwidths like 10 mHz, which is very difficult for analog PLL's. Again a digital PLL relies on the stability of its clock.

c) A digital PLL can handle extremely low input frequencies like 1 Hz. An analog PLL will introduce a lot of noise at the phase detector, charge pump and the like, as all the noise from the analog elements will be folded back into a small frequency band.

A typical digital PLL looks a lot like an analog PLL, as shown in FIG. 2. If we accept that digital processing can be designed such that errors, such as rounding and cut-off errors, can always be limited to low enough levels, the following remaining error sources exist:

a) The system clock (stability, noise) will be part of the remaining error terms.

b) The input sampling limits accuracy.

c) The output frequency synthesis limits accuracy, both by being in the feedback loop as in direct output contribution.

Various prior art circuits are described in U.S. Pat. Nos. 5,602,884; 7,006,590; and 5,905,388.

SUMMARY OF THE INVENTION

According to the present invention there is provided a digital phase locked loop comprising a phase acquisition unit receiving a sampled input signal at a first input; a digital phase detector receiving at a first input an output of the phase acquisition unit; a digital controlled oscillator producing a digital output signal; and a feedback path coupling the digital output signal of the digital controlled oscillator to a second input of the digital phase detector in the digital domain.

Different types of clock detection type for single ended acquisition can be employed: asynchronous, synchronous and sub-synchronous (small offset). In one aspect the invention provides a novel asynchronous method of sample any input signal in order to achieve better performance in time quantization. As a result there is an additional advantage of being able to share the necessary clock between many quantizers, thus reducing power when many reference signals are sampled.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENTS

Figure 1:
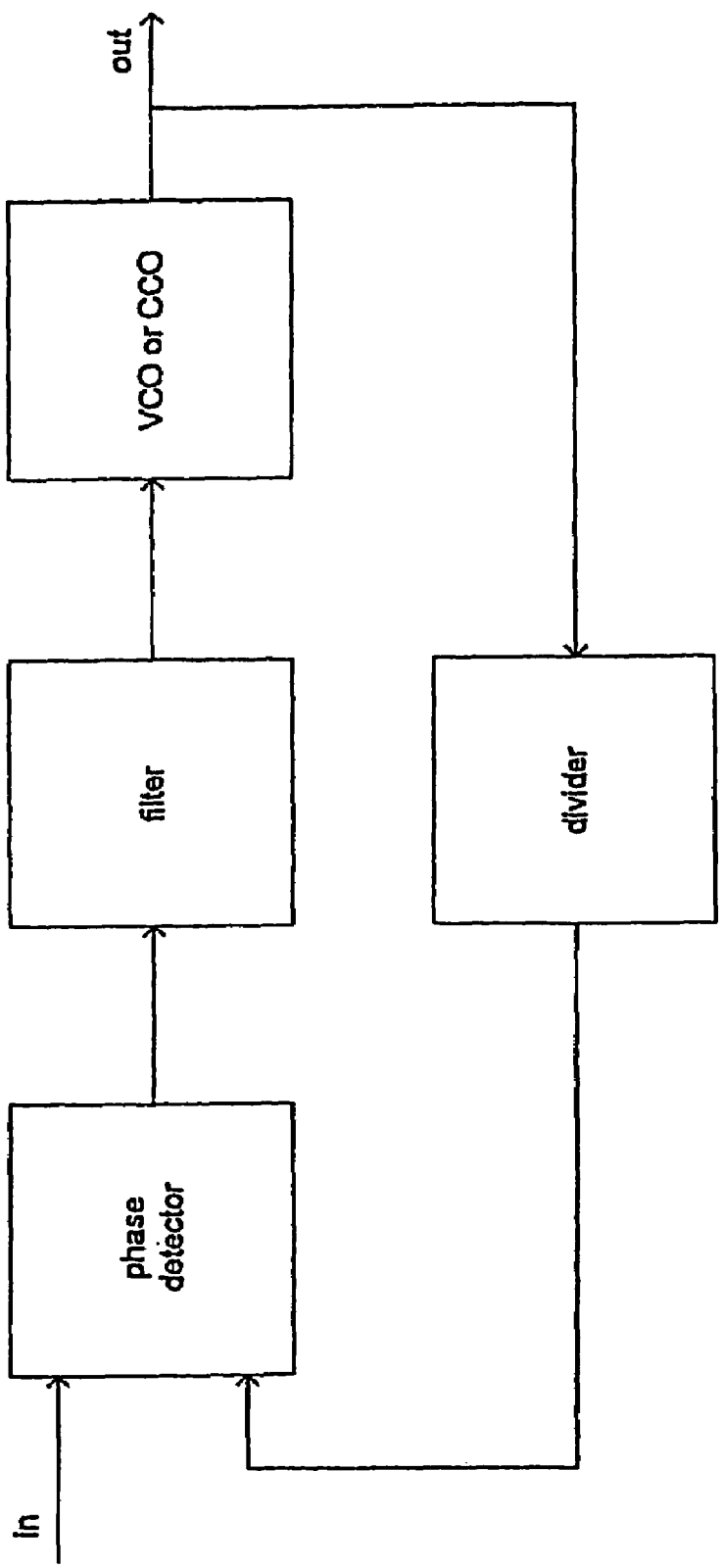
FIG. 1 is a block diagram of a prior art analog PLL.
Figure 2:
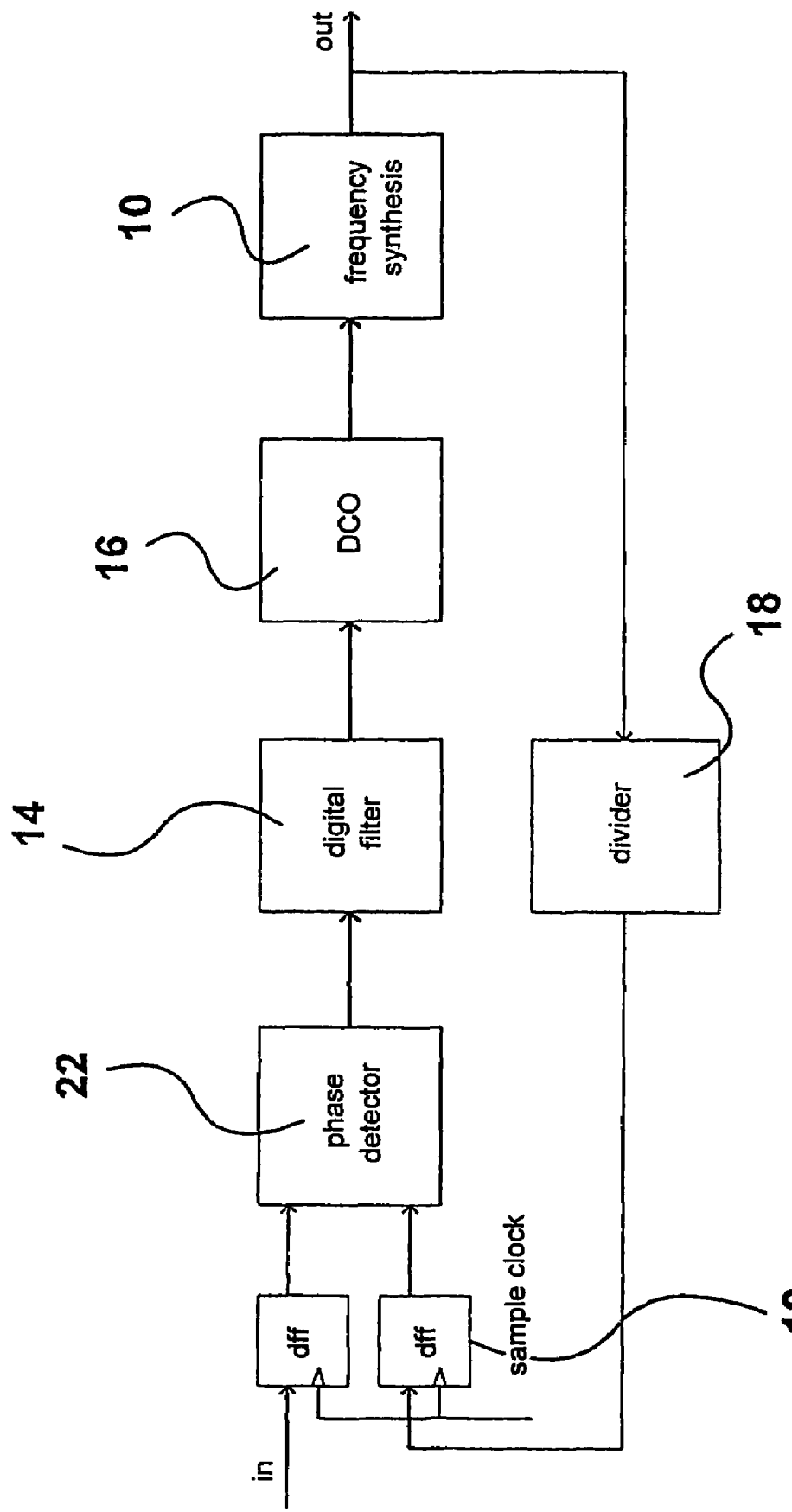
FIG. 2 is a block diagram of a digital PLL.

Referring to FIG. 2, this shows a digital PLL with a digital phase detector 14 supplying a control signal to the DCO 10 via a loop filter 20. The physical output of the PLL is provided by the frequency synthesizer 10. The divider feeds the output of the frequency synthesizer back through the divider 18 to D-type sampling flip flops 12, which produce the digital input to the phase detector.

Figure 3:
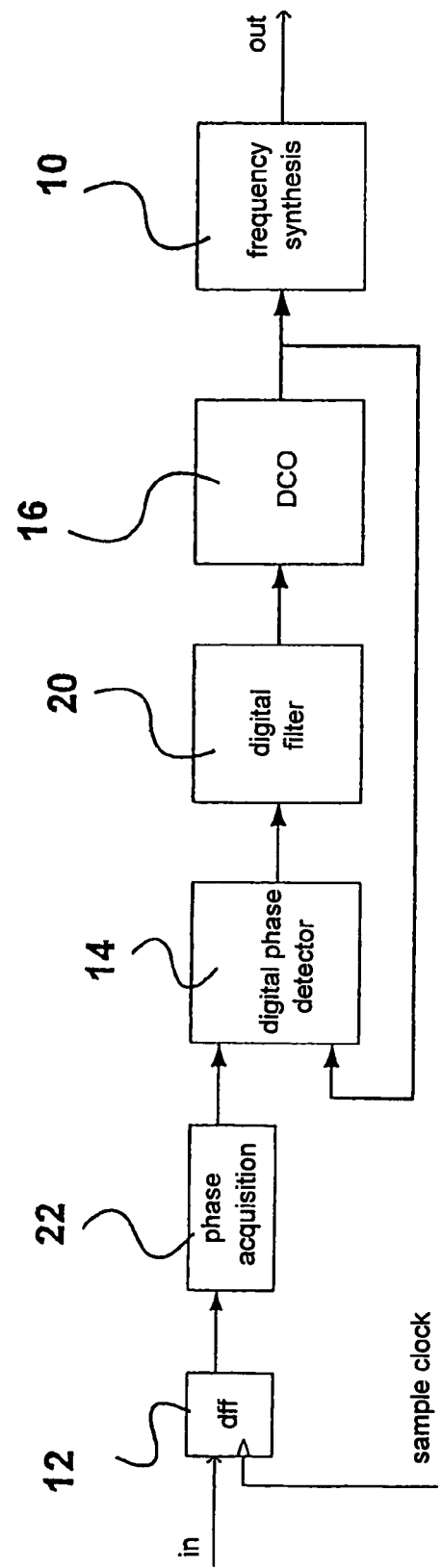
FIG. 3 is a block diagram digital PLL with phase acquisition and all digital loop.

The feedback clock is actually a close derivative of the output of the DCO, especially if the DCO is expanded to cover lower frequencies. The implication of this observation is that the sampling of the feedback signal actually does not yield additional information, but at best may add noise. In other words, there is no information in the feedback signal that was not already present in the DCO output signals. This means that the loop can be changed to a single ended (two port) input section and a numerical loop as shown in FIG. 3.

The mapping from DCO through frequency synthesis through the feedback divider has been eliminated without really changing the nature of the loop. The use of a numerical loop has a lot of advantages, such as simpler verification, change of filter characteristics by changing the mathematics in the numerical loop and the. At the same time it should be understood that asynchronous detection with dithering, does not depend on the use of elimination of the feedback divider, but serves to make clear that actually the performance of the loop is principally limited by the sampling process of the input signal, whereas the feedback signal is not really limited in accuracy.

The clock driving the sampling flip-flop 12 needs to have a fairly good performance. Any noise on the sampling clock can be viewed as the same noise (albeit with opposite sign) on the input with a noise-free clock, and thus is subject to the transfer of the digital loop. If there is too much noise on the sampling clock, the noise on the input may feed through the transfer from input to output at such a level that the output requirements for jitter are no longer met. In real implementations this implies that the quality of the sampling clock needs to be at least fairly good and, for wide bandwidths of the PLL, contributes a large part of the total budget for the output jitter. The quality of that clock is high and therefore expensive in power and area terms. The power aspect can be of importance for further performance issues: when all signals are processed on a single substrate of a chip every bit of power consumption will reflect upon the final noise performance. It is thus quite attractive to have as few sample clock signals as possible.

In generic terms, performance of a sampling clock can be and should expressed in terms of quantization noise. Any clock will have a best acute performance that is directly related to the absolute frequency: the higher the sampling clock, the smaller the sampling error. For instance will a 1 GHz clock infer quantization noise of 1 ns peak-peak? This is the acute accuracy. Accuracy improvement is only possible by looking at the relationship of sampled signal and sampling clock over longer periods. This is a commonality between all possible sample methods.

In various earlier implementations of the digital phase locked loop use has been made of synchronous detection, asynchronous detection and sub-synchronous detection. The various detection methods have slightly different clock settings:

a) Synchronous detection chooses the sample clock to trace the input signal as an integer multiple thereof. $f_{sample\_clock} = N * f_{input}$. The acute phase error can be anything between 0 and 1 sample clock cycle, and will be forced to DC, due to the tracking. This is undesirable as the phase detector will at first have 0 as a possible output, in which case the output will drift (at very low speeds) relative to the output with a peak-peak behaviour of that 1 sample clock cycle. In an adapted phase detector this can be changed to not allow the 0 position and use for instance −½ and +½ instead of 0 and 1 sample clock cycle. This however will lead to a 'hunting' (limit cycle) behaviour around quantization levels.

b) Sub-synchronous detection chooses the sample clock on the same frequency as the synchronous detection but adds a small offset, for instance 1 kHz. This implies that the input quantization noise gets a sawtooth-like behaviour, with a size of the sample clock cycle (peak-peak) and a repetition rate (in this example) of 1 kHz. This error can be filtered by the use of a low bandwidth DPLL c) Asynchronous detection puts no particular relationship between input and sample clock. In general terms this is simplest to implement. It does create an input quantization error uncertainty in the time domain and spectrum and subsequently is impossible to filter reliably.

The main advantage of synchronous detection circuits is that the performance is relatively easily controlled, but at the cost of fixed relationships between the sampled signal and the sampling clock. This gives the effect that where a sampling clock works very accurate for one input, it can be extremely inaccurate for the next signal. This implies that a circuit with multiple digital inputs that all need accurate sampling, requires a separate sampling clock for each input signal. That is a costly operation: the sampling clocks are still required to have a good quality, but now there is a multiple of them. Thus the power goes up, performance of the complete system likely goes down.

The main advantage of asynchronous detection is that the detection is in general sense equally 'bad' for all inputs, and does not suffer from sharing the same clock over multiple input signals. This reduces the extra power requirements of having more than one sample clock generated, and is thus quite crucial for performance of other aspects of the design. However, asynchronous detection has the disadvantage that the acute accuracy is still limited to a single cycle of the sample clock, and that it is not simple to state anything about the longer term quantization noise. At a quite high detection speed of 1 GHz this would imply an inaccuracy of 1 ns peak-peak, which for quite a few applications is just not good enough.

Figure 4:
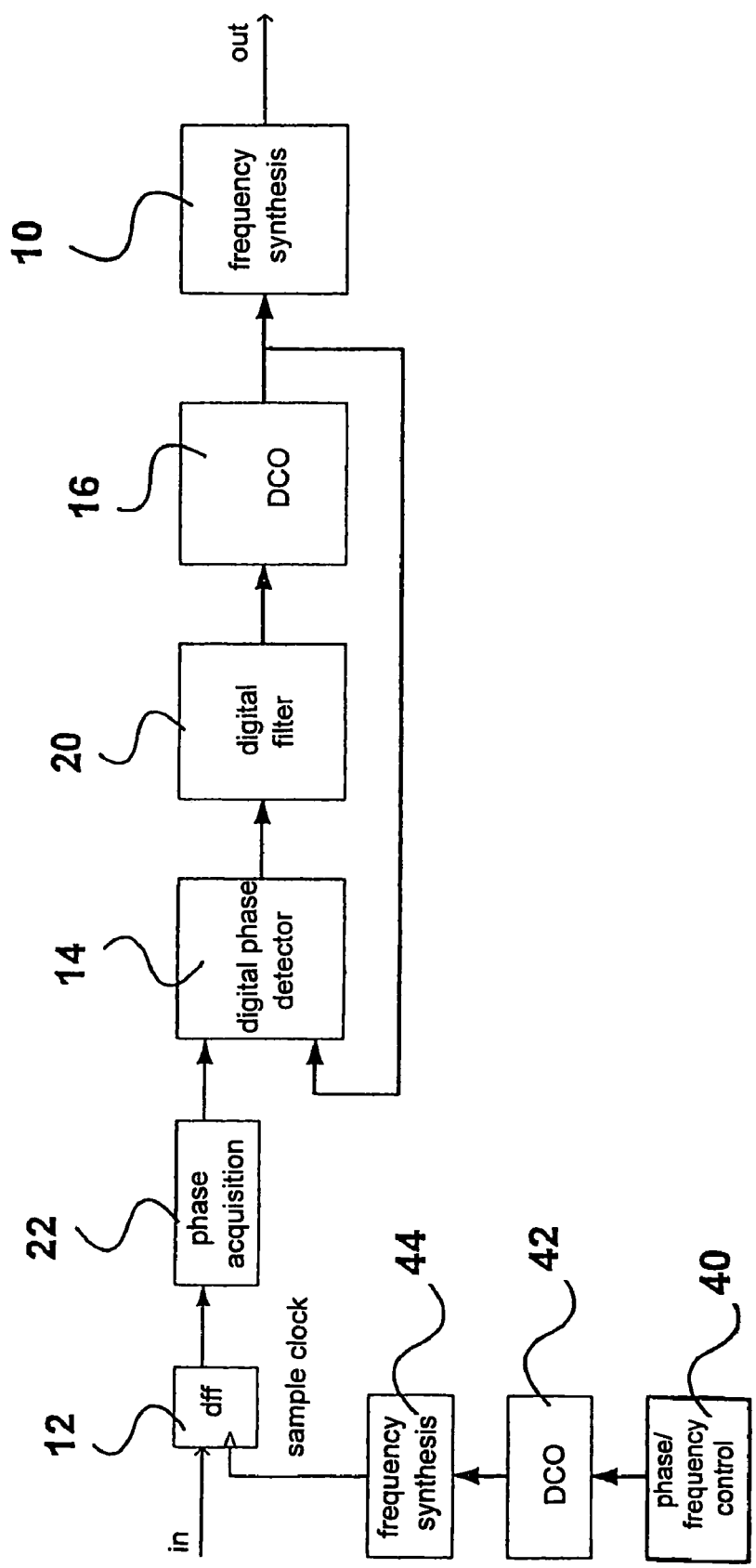
FIG. 4 is a block diagram of a PLL with asynchronous detection and phase/frequency control.

In synchronous detection system it is relatively straightforward to improve the quantization noise to acceptable levels, but then the penalty of extra power and area hits and overall performance gets worse. And, using synchronous detection is a form of feedback which influences the complexity of things a bit further. It is very attractive to be able to use an asynchronous phase acquisition block with decent performance, as that enables the avoidance of a physical feedback signal (costly and complex) be it sample clock or real feedback, while giving good enough performance. This is reached by expanding the embodiment of FIG. 3 with control means on the sample clock. This may look like the embodiment shown in FIG. 4. In FIG. 4, the sample clock is produced by a frequency synthesizer 44, receiving an input from DCO 42 in turn controlled by phase/frequency controller 40.

The control given is in the frequency and phase domain of the sample clock. Real implementations may use only one of the two control sides, if only since phase is the integral of the frequency.

Figure 5:
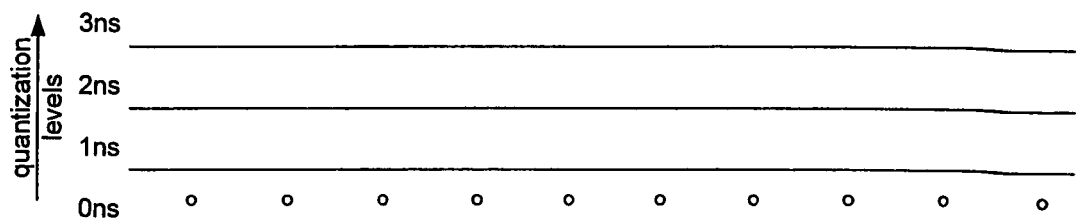
FIG. 5 shows the quantization levels in graphical fashion.

The type of control given over the sample clock can take on many forms. In order to clarify the different types we introduce graphical method to show the quantization noise in a figure. In FIG. 5 the quantization levels are introduced as a vertical axis even though they actually are also in the time domain. The edges of the input signal are indicated with the dots in the figure. This particular sample diagram shows a DC quantization error (which is a special case). There are of course a number of real sample clock cycles between individual input edges, but that number is treated as a common factor which is taken out of the equation as that number has no bearing for the information in the quantization error.

Figure 6:
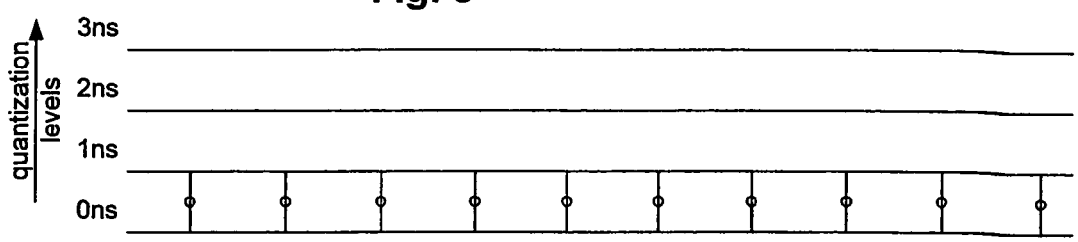
FIG. 6 shows the quantization levels with quantization noise ranges.

In FIG. 6 the range of possible correct edge moments is added as a small vertical line for each edge of the input signal.

Figure 7:
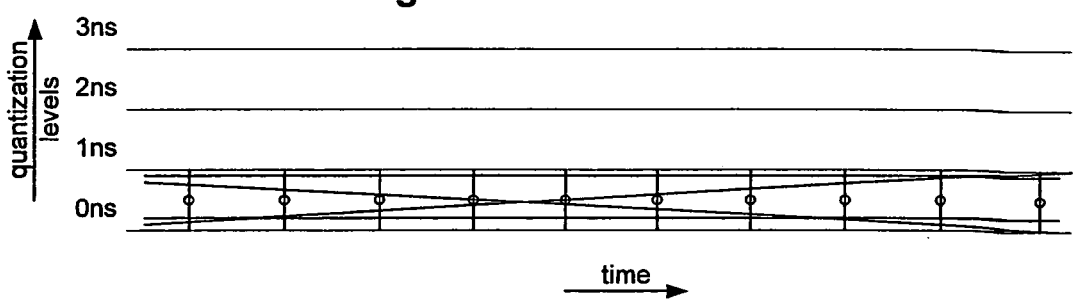
FIG. 7 shows the quantization levels and reconstruction of a number of correct phase lines.
Figure 8:
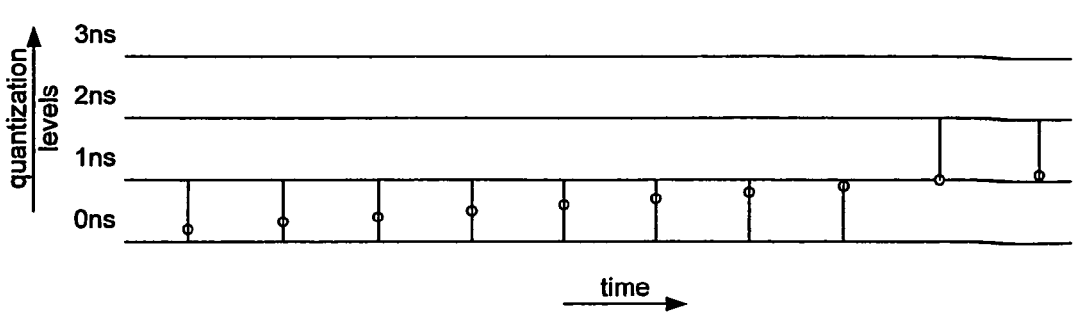
FIG. 8 shows the general input frequency quantized.

In FIG. 7 a number of possible straight lines is drawn that all are in agreement with the detected edges after quantization.

The quantization errors can now always be defined as +−½ a sample cycle or quantization level. What is more, between two reference edges the maximum change of quantization level can always be drawn within the range of +−½ a quantization level. After all, if it were for instance 0.6 quantization level from edge to edge, it could be redrawn as −0.4 quantization level, with a increment of 1 on the common number of sample clock cycles between input edges.

It can help understanding if the mutuality between the input and the sample clock is observed: the sample clock samples the input, but actually the input also 'samples' the sample clock: only one out of many sample clocks are 'picked' to give information. This again can be related to the quantization error between +−0.5 sample clock cycles.

Most sample situations will not look as in FIG. 5, but actually more as in 8, with a small fractional offset between input frequency and sample frequency. This Figure more clearly shows the effect of quantization errors: the places where the quantization levels are cut by the input signal give extra information, but the frequency where that information is depends on the small (a priori unknown) frequency offset.

Now we have to establish proper methods to reach smaller quantization noise, i.e. establish the actual phase lines with more accuracy than sketched in FIG. 7. There are many commonalties with normal AD conversion, and we the following methods to yield good results: Structural dither and Pseudorandom or noisy dither.

Both methods are aimed at having the input phase line traverse over the quantization lines, as that yields the phase information that we are looking for.

Figure 9:
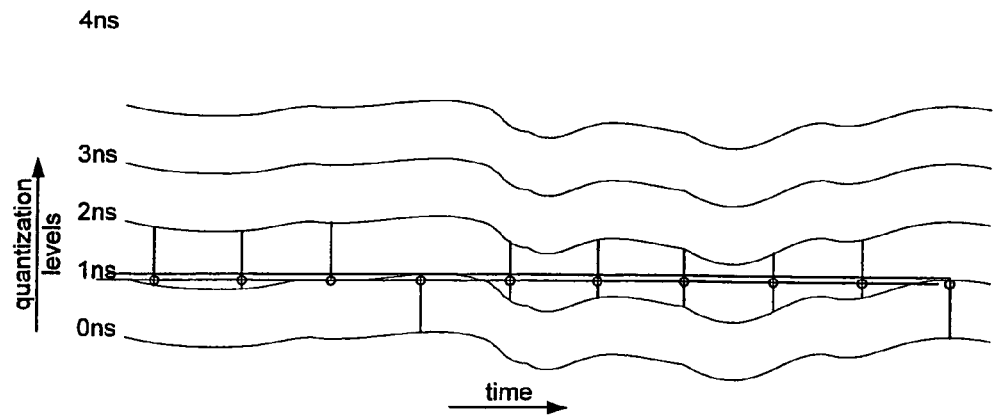
FIG. 9 is a diagram showing structural dither in the form of two-tone detection.

A first way to get these traversing points is to change the quantization lines from straight horizontal lines into sloped lines, thus solving the main problem for DC quantization errors. This is shown in FIG. 9. The detected frequency in FIG. 9 is now synchronous with the sample clock, and it is important to understand also what happens if that frequency is not so closely related to the clock, a situation that is shown in FIG. 10.

Figure 10:
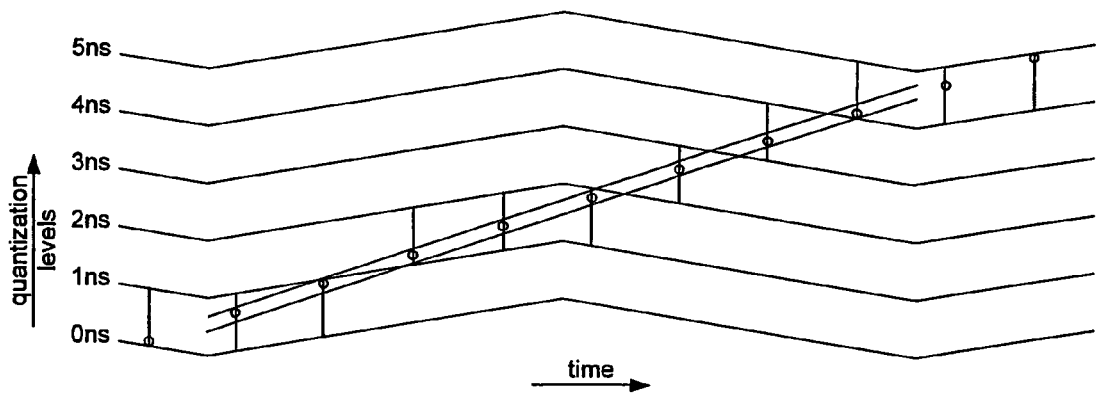
FIG. 10 is a diagram showing structural dither in the form of a two-tone detection with the input frequency not synchronous.
Figure 11:
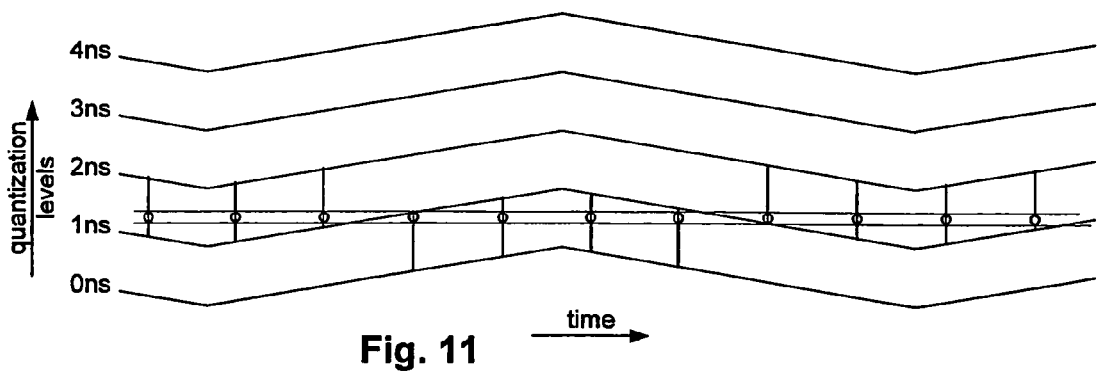
FIG. 11 is a diagram showing pseudorandom dither.

In FIG. 10, the dithering yields more points where the quantization lines are traversed, and actually it can be read that the lines that can be drawn have a phase error maximum that is only 25% cycle of the sample clock, so the improvement is a factor 4. It cannot be guaranteed that both tones yield extra information, which explains that the 8 input edges do not yield an improvement with a factor 8, but half of that value. The dithering form is a triangular phase offset, which is the same as using two detection frequencies in turn (therefore two-tone detection).

The actual recovery of the correct phase line is now possible, as shown, and actual recovery of a phase line is correct but not necessarily a robust operation with this method. Robustness typically requires less coherence between input frequency and sample clock, which can be helped by adding more than one dither signal, so a superposition of several tones. For instance use of a mix of high frequency and low frequency triangle, or two triangles with a small frequency difference (yielding a beat) etcetera. In the limit of using many frequencies this will become identical to a noisy signal, which is the second class of dither: noise or pseudorandom noise. There the big advantage is that robustness never is an issue: simple averaging does the trick.

Pseudorandom dithering has a few major advantages:
a) The control over the dither means that the 'noise' does not need to enter the loop: it is a known and controlled quantity so that there is no feed-through of the pseudo random noise if not desired.
b) The improvement of the phase line acquisition can be reached with simple averaging means, which is a simple function to implement, in hardware just as in software.
c) The pseudorandom dithered signal will introduce somewhat less problems with phase pulling in an integrated solution than a steady clock signal.

The biggest limitation of the performance improvement of the pseudorandom dither is that it behaves with square root only, not linear. But for real use of digital PLL's this is sufficient.

The invention claimed is:

1. A digital phase locked loop comprising:
a phase acquisition unit receiving a sampled input signal at a first input;
a digital phase detector receiving at a first input an output of the phase acquisition unit;
a digital controlled oscillator producing a digital output signal;
a feedback path coupling the digital output signal of the digital controlled oscillator to a second input of the digital phase detector in the digital domain;
a sampling unit coupled to an input of the phase acquisition unit clocked by an asynchronous clock signal;
a clock for providing said asynchronous clock signal; and
a phase/frequency controller for dithering said asynchronous clock signal.

2. A digital phase locked loop as claimed in claim 1, further comprising a frequency synthesizer for generating a physical frequency signal from the output of the digital controlled oscillator.

3. A digital phase locked loop as claimed in claim 2, further comprising a second digital controlled oscillator connected to a second frequency synthesizer for providing said clock.

4. A digital phase locked loop as claimed in claim 3, wherein said phase/frequency controller controls said second digital controlled oscillator.

5. A digital phase locked loop comprising:
an asynchronous sampling unit for sampling an input signal;
a phase acquisition unit receiving the sampled input signal;
a digital controlled oscillator producing a digital output;
a control loop for the digital controlled oscillator; and a dithered clock for providing a dithered clock signal to the asynchronous sampling unit.

6. A digital phase locked loop as claimed in claim 5, further comprising a feedback path coupling the digital output of the digital controlled oscillator to a second input of the phase acquisition unit in the digital domain.

* * * * *